United States Patent [19]
Hewlett

[11] Patent Number: 4,656,498
[45] Date of Patent: Apr. 7, 1987

[54] OXIDE-ISOLATED INTEGRATED SCHOTTKY LOGIC

[75] Inventor: Frank W. Hewlett, Dallas, Tex.

[73] Assignee: Texas Instruments Incorporated, Dallas, Tex.

[21] Appl. No.: 200,834

[22] Filed: Oct. 27, 1980

[51] Int. Cl.$^4$ ............................................. H01L 27/04
[52] U.S. Cl. ........................................ 357/50; 357/15
[58] Field of Search ..................... 357/15, 50, 44, 46, 357/92

[56] References Cited
U.S. PATENT DOCUMENTS 3,783,047  1/1974  Paffen et al. ........................... 357/50
4,048,517  9/1977  Rathbone et al. ..................... 357/50
4,107,835  8/1978  Bindell et al. ......................... 357/15

OTHER PUBLICATIONS

Lohstroh, IEEE J. Solid State Circuits, vol. SC 14, No. 3, pp. 585-590 (Jun. 1979).

Primary Examiner—William D. Larkins
Attorney, Agent, or Firm—Richard A. Bachand; N. Rhys Merrett; Melvin Sharp

[57] ABSTRACT

A logic unit used as the basic building block in a bipolar integrated circuit is formed in a rectangular oxide-isolated island wherein thick oxide walls at one end of the island define three of four edges of a P-type region which serves both as the base of an NPN drive transistor and the emitter of a PNP clamp transistor. An input contact to the logic unit is disposed on the upper semiconductor surface of the island in ohmic contact with the common P-type region. The input contact extends across the entire width of the island to minimize the base resistance of the drive transistor and thus increase the switching speed of the logic unit.

11 Claims, 3 Drawing Figures

OXIDE-ISOLATED INTEGRATED SCHOTTKY LOGIC

The present invention pertains generally to semiconductor devices and particularly to integrated circuits employing bipolar transistor logic circuitry.

In bipolar integrated circuits of the prior art, logic circuitry is implemented using a plurality of logic units which are interconnected to perform a desired logic function. Each logic unit typically comprises a bipolar transistor and multiple inputs to its base or multiple outputs from its collector. Each such transistor provides signal amplification and inversion and will be referred to herein as the drive transistor. Common multiple-input logic forms include Schottky diode logic (SDL) and transistor-transistor logic (TTL). Common multiple-output logic forms include Schottky transistor logic (STL) and integrated injection logic (I²L).

The semiconductor industry has continued to improve the performance of semiconductor devices by increasing the speed and reducing the power required to perform logic operations. Efforts to increase the speed of operation of a logic unit are often directed to reducing the amount of charge stored by the circuit elements or increasing the speed by which such charge can be transferred. Certain implementations of the common logic forms employ a Schottky diode to clamp the collector-base junction of the drive transistor to minimize charge storage when the transistor is turned on. Another logic form known as integrated Schottky logic (ISL) employs a clamp transistor to control the charge saturation of the drive transistor. A junction-isolated form of ISL is described in an article by Jan Lohstroh entitled "ISL, a fast and dense low-power logic, made in a standard Schottky process" published in *IEEE Journal of Solid-State Circuits*, Vol. SC 14 pp. 585–590, June 1979. The terms of this article are incorporated by reference herein in order to illustrate the state of the art.

The present invention has for its principal object the provision of an improved form of integrated Schottky logic. Other objects and advantages of the present invention will become apparent upon consideration of a preferred embodiment thereof as will now be described with reference to the accompanying drawing, in which.

Figure 1:
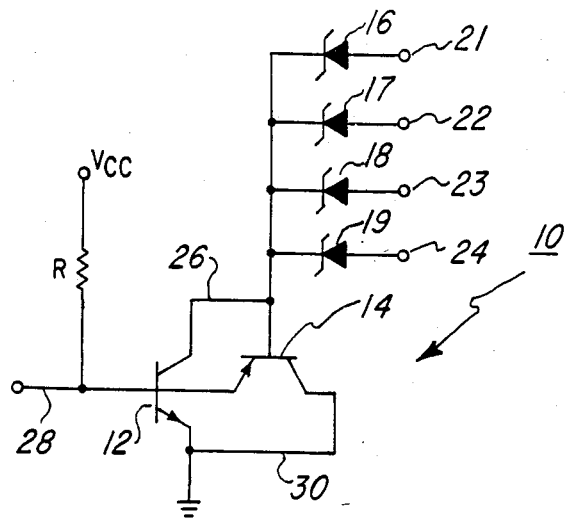
FIG. 1 is an equivalent circuit of a logic unit in accordance with the present invention.

Referring to FIG. 1, an equivalent circuit of one embodiment of a logic unit in accordance with the invention is illustrated and designated generally by reference numeral 10. Those skilled in the art will recognize the logic unit 10 to be a single-input, multiple-output inverter implemented using an NPN drive transistor 12, a PNP clamp transistor 14, and, in this example, four Schottky barrier diodes, 16, 17, 18, and 19 whose anodes provide output nodes 21, 22, 23, and 24. The cathodes of the diodes 16–19 are each connected to a node 26 which defines the base of the clamp transistor 14 and the collector of the drive transistor 12. An input node 28 is defined by the base of the drive transistor 12 and the emitter of the clamp transistor 14. A source of current to the input node 28 is provided by means of a positive voltage source $V_{cc}$ connected to the input node 28 through a resistor R. The emitter of the drive transistor 12 and the collector of the clamp transistor 14 are connected to a ground node 30 or other source of potential sufficiently below the $V_{cc}$ potential.

In operation, a potential representative of a high logic level is applied at the input node 28 to turn on the drive transistor 12 in order to pull node 26 down to a potential just slightly above ground, thereby holding the output nodes 21–24 at a potential representative of a low logic level. The clamp transistor 14 drains off most of the current supplied by $V_{cc}$ as soon as the base-collector junction of the drive transistor 12 becomes forward-biased. Although the drive transistor 12 is allowed to go into saturation, it is prevented from going heavily into saturation by the clamp transistor 14. When a low logic level appears at the input node 28, the drive transistor 12 cuts off, thereby isolating node 26 from ground and allowing the output nodes 21–24 to be brought up to a high logic level.

Now referring to FIGS. 2 and 3, an implementation of the logic unit 10 of FIG. 1 in a semiconductor circuit device 40 in accordance with the present invention will be described. A portion of the semiconductor device 40 is illustrated at a processing stage wherein the logic unit 10 has been formed but interconnections with similar logic units (not shown) have not yet been formed. The portion illustrated includes upper regions of a body of semiconductor material 42. The body 42 includes a substrate region 44 which preferably is formed from P-type monolithic silicon starting material having a resistivity of about 10 to 15 ohm-cm. A relatively low resistivity zone 46 of the opposite conductivity type, which is referred to in the art as an N+ buried collector, is formed by diffusing a high concentration of donor impurities, such as antimony, into an upper portion of the substrate 44. The body 42 also includes a relatively high resistivity zone 48 of N-type conductivity preferably formed by growing an epitaxial layer on the substrate 44 over the buried collector zone 46. The zone 48 is characterised by a relatively low concentration of donor impurities preferably exhibiting a resistivity of about 1 ohm-cm. The zones 46 and 48 together form a single N-type region which is the electrical equivalent of the node 26 of FIG. 1. A dashed line 49 is used merely to illustrate the location of the plane at which the change from relatively low to relatively high resistivity occurs. A thick field oxide layer 50 is selectively grown down through zone 48 to provide isolated active areas or islands, only one being shown, within which logic units in accordance with the invention or other logic circuitry are then formed. Underlying the field oxide layer 50 is a P+ channel stop region 52 which extends down into the substrate 44 to provide electrical isolation between active areas.

Figure 2:
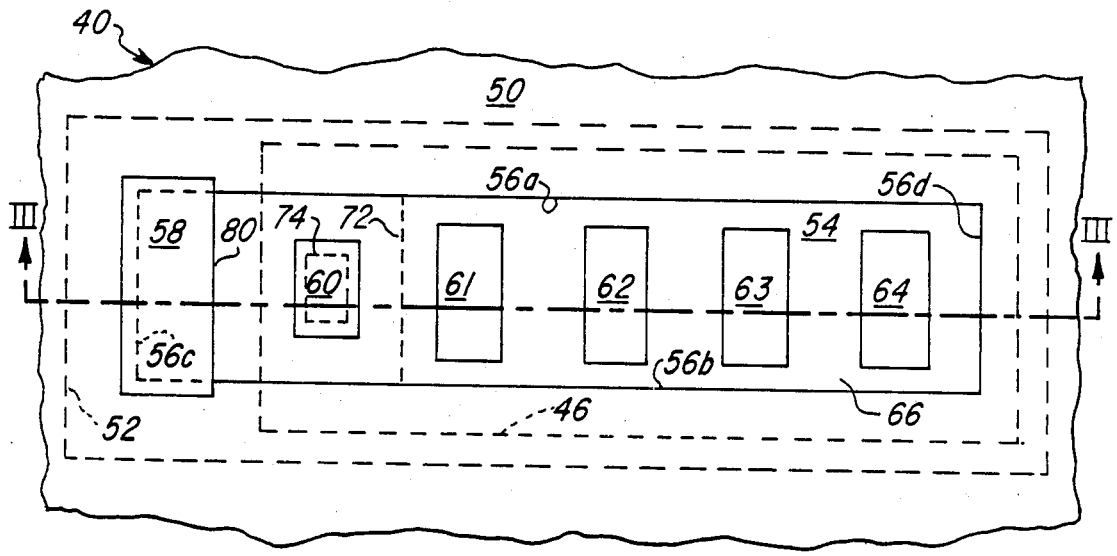
FIG. 2 is a schematic plan view of the inventive logic unit.

In the plan view of FIG. 2, the active area appears as an elongated rectangular region 54 whose perimeter is defined by four vertical walls or edges of the field oxide layer 50, the vertical walls including sidewalls 56a and 56b and endwalls 56c and 56d. The active area 54 has an upper surface, designated by reference numeral 57 in FIG. 3, upon which are formed an input contact 58, a ground contact 60, and four output contacts 61, 62, 63, and 64 corresponding respectively to the input node 28, the ground node 30, and the output nodes 21–24 shown in the circuit schematic of FIG. 1. Conventional metalization techniques are used for form ohmic contacts at the interfaces of the contacts 58 and 60 with the semiconductor surface 57 and to form PtSi Schottky barrier diodes at the interfaces of the contacts 61–64 with semiconductor surface 57. Preferably, the effective barrier height of each such diode is adjusted by means of a selective phosphorus implantation using an energy of about 35 keV and a dose of about $8 \times 10^{+12} cm^{-2}$. A thin passivating oxide layer 66 covers those portions of the surface 57 of the active area 54 which are not contacted by the contacts 58, 60, 61–64.

As seen best in FIG. 3, a P-type region 68 is provided in a portion of the active area 54 extending laterally below the contacts 58 and 60 and a smaller N-type region 70 is provided immediately under the contact 60. It will be appreciated that the regions 68 and 70 are formed prior to the metalization step used to form the contacts 58 and 60. The P-type region 68 is preferably formed in a conventional manner by diffusion of an acceptor impurity such as boron into an unmasked portion of the epitaxial layer which forms the zone 48 to form a PN junction 72 with an underlying portion of the zone 48. The N-type region 70 is preferably formed by selective ion-implantation of arsenic impurities which are subsequently driven to a depth of about 0.25 microns where a PN junction 74 is formed with the underlying P-type region 68. The PN junction 72 lies at a depth of about 0.5 microns and is bounded along three of four edges by the endwalls 56c and adjoining portions of the sidewalls 56a and 56b of the field oxide 50. The PN junction 72 turns upward to provide a fourth edge terminating at the upper surface 57 of the semiconductor body 42 under a portion of the thin oxide 66 lying between contacts 60 and 61. The N-type high resistivity zone 48 includes a first portion lying along the upper surface 57 immediately under the contacts 61–64, a second portion underlying the P-type region 68 in vertical alignment below the N-type region 70, and a third portion underlying the P-type region 68 in vertical alignment below the input contact 58. The N+ low resistivity zone 46 underlies the first and second portions but not the third portion of the zone 48. In other words, the P-type substrate 44 extends up beyond zone 46 to form a PN junction 76a with the portion of zone 48 that underlies the input contact 58. An adjoining PN junction 76b is formed between the N+ zone 46 and the underlying portions of the substrate 44. The PN junction 76a preferably lies at a depth of about 1.5 microns.

Figure 3:
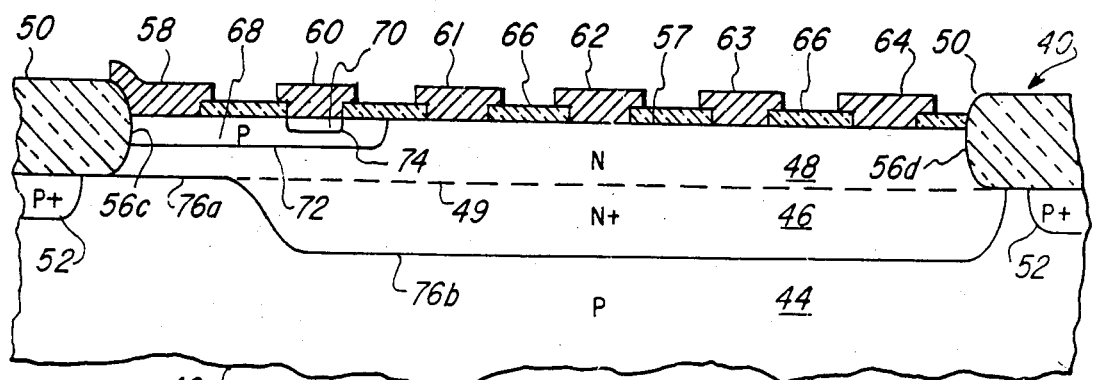
FIG. 3 is a schematic cross section of the unit of FIG. 2 taken along line III—III.

From the foregoing description of the preferred structure shown in FIGS. 2 and 3, it will be apparent that the NPN drive transistor 12 of FIG. 1 is formed by the semiconductor regions underlying the ground contact 60, wherein region 70 forms the N-type emitter, region 68 forms the P-type base, and the dual region 46-48 forms the N-type collector. Likewise, it will be apparent that the PNP clamp transistor 14 of FIG. 1 is formed by the semiconductor regions underlying the input contact 58, wherein region 68 forms the P-type emitter, zone 48 forms the N-type base, and the substrate 44 forms the P-type collector. The base width of the PNP clamp transistor 14 as determined by the distance separating the PN junctions 72 and 76a is preferably about 1.0 micron. As previously mentioned, the Schottky barrier diodes 21–24 are formed at the metal-semiconductor interfaces between contacts 61–64 and the N-type high resistivity zone 48. Those skilled in the art will appreciate that some or all of the Schottky barrier diodes 21–24 as well as additional diodes can be provided in a separate island (not shown). In addition, as in conventional in the art, the resistor R of the circuit of FIG. 1 is preferably provided in a separate island and thus is not shown in FIGS. 2 and 3. Interconnections between the input contact 58 and the resistor R as well as input and output interconnections between the logic unit 10 and similar logic units are preferably formed using a first level metalization. Interconnections between resistor islands and a $V_{cc}$ source pad as well as between the ground contact 60 and a ground potential pad are preferably formed using a second level metalization. Such interconnections are not illustrated inasmuch as their structure and method of fabrication are known in the art.

The present invention provides an oxide-isolated form of ISL exhibiting significantly improved performance over the junction-isolated ISL form described by Lohstroh in the above-referenced article. Junction isolation is achieved by means of a P+ isolation region extending from the semiconductor surface down to a P-type substrate. In such prior-art form of ISL, the P+ isolation region surrounds the N-type collector of an NPN drive transistor. The N-type collector laterally separates the P-type base from the P+ isolation region thereby forming a lateral PNP clamp transistor. With the provision of a vertical PNP clamp transistor working in parallel, the lateral PNP clamp transistor is functionally redundant. Although the lateral PNP clamp transistor is an inherent part of and cannot be eliminated from the junction-isolated ISL structure of the prior art, it is an unneccessary element of the oxide-isolated ISL structure of the present invention. The field oxide layer 50 isolates the active area or island 56 from other such islands in the semiconductor device. As seen most clearly in FIG. 3, the P-type region 68 extends laterally to the edge of the field oxide layer 50 where the vertical PNP clamp transistor is formed. Those skilled in the art will appreciate that elimination of the capacitance associated with the P+ isolation region and the lateral PNP clamp transistor of the junction-isolated structure of the prior art enhances the switching speed of the logic unit 10. The novel structure of FIGS. 2 and 3 achieve this desirable result.

Another important feature of the inventive structure will now be described with reference to FIGS. 2 and 3. The input contact 58 is made unusually large and preferably extends to the endwall 56c and the adjoining portions of the sidewalls 56a and 56b of the field oxide 50. For ease of fabrication, the metal of the input cntact 58 is allowed to slightly overlap the field oxide as shown. The relatively large size of the input contact 58 reduces the dynamic capacitance of the base-emitter junction 72 of the clamp transistor thereby increasing the switching speed of the logic unit. Furthermore, the length of a straight edge 80 of the input contact 58 determines the lateral resistance in the P-type region 68 between the input contact and the emitter region 70 of the drive transistor (i.e., the base resistance of the drive transistor). The length of the straight edge 80 is as large as it can be since the input contact 58 extends entirely across the active area 54 between the opposed sidewalls 56a and 56b of the field oxide 50, thereby minimizing the base resistance of the drive transistor. Reduction of such NPN base resistance significantly increases the cutoff frequency particularly at higher operating temperatures. It will be appreciated that the size of the input contact is limited in the junction-isolated ISL form of the prior art since the input contact cannot extend to the P+ isolation region without shorting out the collector-base junction of the drive transistor.

From the foregoing, it will be apparent to those skilled in the art that the present invention provides an improved bipolar logic form exhibiting both reduced charge storage and reduced impedance to charge transfer, thereby providing significantly improved performance in signal propagation speed compared to similar logic forms of the prior art.

Although a preferred embodiment of the invention has been described in detail, it is to be understood that modifications thereof are within the spirit and scope of the invention as defined by the appended claims.

What is claimed is:

1. In a semiconductor device having a body of semiconductor material and a thick oxide layer formed on the body for defining isolated active areas within the body, the logic unit comprising:
   a first region of the body formed along an upper surface thereof and characterized by impurities of a first conductivity type,
   a second region of the body characterized by impurities of a second conductivity type and having a portion underlying the first region and a portion extending to the upper surface,
   an input contact disposed on the upper surface of the semiconductor body in ohmic contact with the second region,
   a third region of the body characterized by impurities of the first conductivity type and having a portion underlying the second region and a portion extending to the upper surface,
   a fourth region of the body characterized by impurities of the second conductivity type and underlying the third region,
   PN junctions being formed where regions of the first conductivity type meet regions of the second conductivity type, the first, second and third regions defining respectively the emitter, base and collector of a drive transistor, the second, third and fourth regions defining respectively the emitter, base and collector of a clamp transistor, the transistors being formed within a single active area of the device defined by walls of the thick oxide layer,
   the walls including first and second opposed sidewalls and first and second opposed endwalls adjoining the sidewalls at opposite ends of the active area, the first endwall and the sidewalls engaging and confining three of four substantially vertical edges of the second region,
   the third region having a high resistivity zone and a low resistivity zone, the high resistivity zone having first, second and third portions, the first portion extending to the upper surface of the semiconductor body and meeting the fourth substantially vertical edge of the second region, the second portion underlying the second region directly below the first region, the third portion underlying the second region directly below the input contact, the low resistivity zone underlying the first and second portions but not the third portion, wherein the fourth region meets the high resistivity zone of the third region under the input contact so as to form the collector-base junction of the clamp transistor, and at least one metal contact disposed on the upper surface in Schottky-barrier-forming contact with the high resistivity zone of the third region.

2. The device of claim 1 wherein the input contact extends entirely across the active area to engage the opposed sidewalls.

3. The device of claim 2 wherein the input contact extends along the upper surface to engage the first endwall.

4. The device of claim 3 wherein the input contact at least slightly overlaps the endwall and the portions of the sidewalls to which it extends.

5. The device of claim 3 wherein the input contact has a straight edge extending along the upper surface spaced from the endwall of the thick oxide layer, the straight edge being parallel to an edge of the first region emerging at the upper surface.

6. The device of claim 5 wherein the base width of the clamp transistor is about 1.0 micron.

7. The device of claim 1 wherein the first conductivity type is N-type and the second conductivity type is P-type and wherein a plurality of Schottky-barrier-forming contacts are made with the high resistivity zone of the third region, the barrier height of each Schottky barrier being adjusted by means of a selective phosphorus implantation using an energy of about 35 KeV and a dose of about $8 \times 10^{+12}$ cm$^{-2}$.

8. The device of claim 7 wherein the portion of the low resistivity zone of the third region which remains substantially unaffected by the selective phosphorus implantation exhibits a resistivity of about 1 ohm-cm.

9. A semiconductor device comprising:
   a body of semiconductor material having a substantially planar upper surface,
   a thick oxide layer defining an isolated active area in the body,
   a vertical NPN drive transistor formed in the active area,
   a vertical PNP clamp transistor formed in the active area, the base of drive transistor and the emitter of the clamp transistor forming a common P-type region, the collector of the drive transistor and the base of the clamp transistor forming a common N-type region,
   a plurality of Schottky barrier diodes formed on the common N-type region,
   characterized in that the thick oxide layer includes opposed sidewalls and the common P-type region includes first and second substantially vertical edges abutting the sidewalls and extending to the upper surface, the common P-type region having a third substantially vertical edge extending across the active area along the upper surface and forming a PN junction with the common N-type region.

10. The device of claim 9 wherein the thick oxide layer includes an endwall and the common P-type includes a fourth substantially vertical edge extending to the upper surface and abutting the endwall.

11. The device of claim 10 further comprising a metallic layer disposed on a major surface of the body in ohmic contact with the common P-type region and extending entirely across the active area, and wherein the emitter of the drive transistor lies between the metallic layer and the third substantially vertical edge of the common P-type region.

* * * * *